United States Patent [19]

Case

[11] 4,328,435

[45] May 4, 1982

[54] DYNAMICALLY SWITCHABLE LOGIC BLOCK FOR JK/EOR FUNCTIONS

[75] Inventor: Jerry R. Case, Tucson, Ariz.

[73] Assignee: International Business Machines Corporation, Armonk, N.Y.

[21] Appl. No.: 108,323

[22] Filed: Dec. 28, 1979

[51] Int. Cl.³ .................. H03K 19/21; H03K 19/088; H03K 19/173

[52] U.S. Cl. .................................. 307/466; 307/289; 307/471

[58] Field of Search .................. 307/272 R, 289, 291, 307/292, 445, 465, 466, 471

[56] References Cited

U.S. PATENT DOCUMENTS 3,654,486  4/1972  Cubert ........................... 307/300 X
3,678,301  7/1972  Fischer et al. ................. 307/290 X
3,742,248  6/1973  Eaton, Jr. ...................... 307/471 X
3,904,891  9/1975  O'Lear .......................... 307/291 X

OTHER PUBLICATIONS

Balasubramanian and Grazier-*IBM Technical Disclosure Bulletin;* "Exclusive OR Output Latch for PLA"; vol. 20; No. 6; pp. 2310-2311; Nov. 77.

*Primary Examiner*—Larry N. Anagnos
*Attorney, Agent, or Firm*—Walter J. Madden, Jr.

[57] ABSTRACT

A circuit provides either the J-K logic function or the Exclusive Or (EOR) logic function depending upon a control signal. The circuit includes a conventional cross-coupled EOR block with two inputs, the logic function being performed by the block depending on the presence or absence of the control signal.

7 Claims, 3 Drawing Figures

DYNAMICALLY SWITCHABLE LOGIC BLOCK FOR JK/EOR FUNCTIONS

TECHNICAL FIELD OF THE INVENTION

The present invention relates to logic circuitry capable of performing either of two logic functions depending on the status of a control signal.

BACKGROUND ART

In the computer art, there are a number of logic functions which are performed by circuitry, and any reduction in the amount of circuitry required to perform a given amount of logic operations is an advantage. One of the common logic functions performed in computers is the Exclusive OR (EOR) function. As the name implies, this function involves generating an output signal when one and only one of two possible input signals is present. Another commonly used logic function is known as the J-K flip-flop logic function.

As is well known to those skilled in the art, the operation of J-K flip-flops is such that if a binary 0 is applied to both the J and K terminals, a subsequent clock pulse will leave the flip-flop in its prior state. However, if a binary 1 is applied to both the J and K terminals, a clock pulse will enable the flip-flop so as to produce an output which represents a change of state from that which existed immediately prior to such enabling. That is to say, that if a J-K flip-flop were in a "clear" condition, which is the equivalent of a binary 0, and a binary 1 is applied to both the J and K terminals of the J-K flip-flop, a subsequent clock pulse would produce a change of state to binary 1 output from the J-K flip-flop. On the other hand, if the flip-flop had previously been in a "set" condition, which is the equivalent of a binary 1, and binary 1's were applied to both the J and K terminals of the J-K flip-flop, a subsequent clock pulse enabling the flip-flop would produce a change of state in its output so that it would produce a binary 0 output signal.

By contrast, if binary 0's are connected as the inputs to both J and K terminals of the J-K flip-flop, the flip-flop would remain in its prior condition producing no change of state output signal so that its output would comprise a binary 0, or a binary 1 dependent upon whether it had previously been in a "clear" condition or a "set" condition, respectively.

The application of a signal to the J input alone causes the flip-flop to assume the set or one state, while the application of a signal to the K input alone causes the flip-flop to assume the reset or zero state.

It would be highly desirable to be able to combine the EOR and J-K functions on a single circuit module and to be able to select either logic function by means of a control signal.

Prior Art

The closest prior art is an IBM Technical Disclosure Bulletin entitled "Exclusive OR Output Latch for PLA", November 1977, at Page 2310–11. In this circuit, the Exclusive OR function is produced by modifying or personalizing a standard J-K flip-flop circuit. Since the standard J-K flip-flop circuit is used, the logic function requires a larger number of circuits to accomplish the Exclusive OR function. There is no showing in the publication of a means for accomplishing both functions from a single circuit by virtue of the actuation of a control line into the circuit.

U.S. Pat. No. 3,678,301, Fischer et al, discloses a combined logic module which functions both as a memory element and as a non-memory element.

U.S. Pat. No. 3,742,248, Eaton, Jr., discloses a device with two circuits utilizing two exclusively cross-coupled OR logic gates.

U.S. Pat. No. 3,654,486, Cubert, discloses a semiconductor type circuit with active feedback.

U.S. Pat. No. 3,904,891 O'Lear, discloses a combinational circuit including a J-K flip-flop and an OR block.

The Invention

In the present invention, a single circuit module has the capability of performing either the Exclusive OR logic function or the J-K flip-flop logic function. A dynamically switchable logic block incorporates a conventional cross-coupled transistor-transistor logic EOR block operated by data inputs logically combined with the stored state of the output of the circuit to enable a J-K flip-flop function, if a control signal is enabled, and an Exclusive OR function if the signal is disabled.

DESCRIPTION OF THE BEST MODE AND INDUSTRIAL APPLICABILITY

Figure 1:
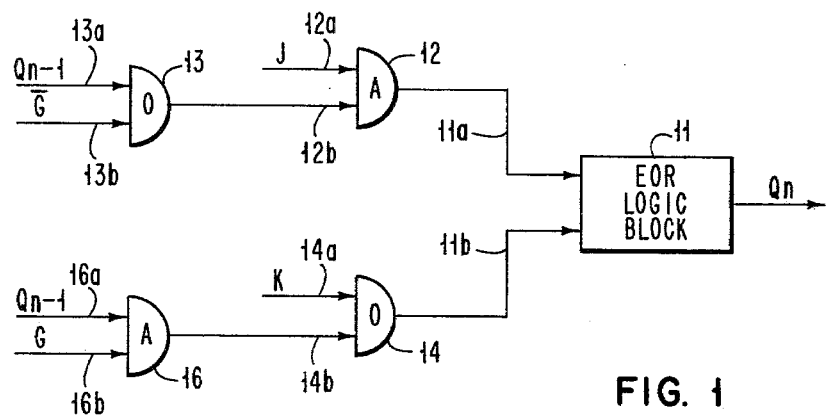
FIG. 1 is a logic block representation of the invention.

FIG. 1 illustrates a logic block representation of the operation of the invention. Reference numeral 11 designates an Exclusive OR function whose output signal is identified as Qn. Block 11 receives one input signal 11a from an AND block 12, block 12 in turn having one input 12a identified as the J input and another input 12b from the output of an OR gate 13. OR gate 13 in turn receives an input 13a identified as Qn-1 to represent the state of the output of block 11 just prior to its current state Qn. The other input 13b of block 13 is identified as G, G being the control or clock signal which controls whether the EOR function or the J-K function is performed in block 11.

The other input 11b 1 to block 11 is supplied from the output of an OR block 14, block 14 having an input 14a identified as the K input and another input 14b from the output of an AND block 16. Block 16 has an input 16a identified as Qn-1 and another input 16b representing the control or clock signal G.

The truth tables for both the J-K function and the EOR function are listed below.

| J-K Flip-Flop | | | EOR | | |
|---|---|---|---|---|---|
| J | K | Qn(output) | J | K | Qn |
| 0 | 0 | Qn−1 | 0 | 0 | 0 |
| 1 | 0 | 1 | 1 | 0 | 1 |
| 0 | 1 | −0 | 0 | 1 | 1 |
| 1 | 1 | Qn−1 | 1 | 1 | 0 |

Figure 2:
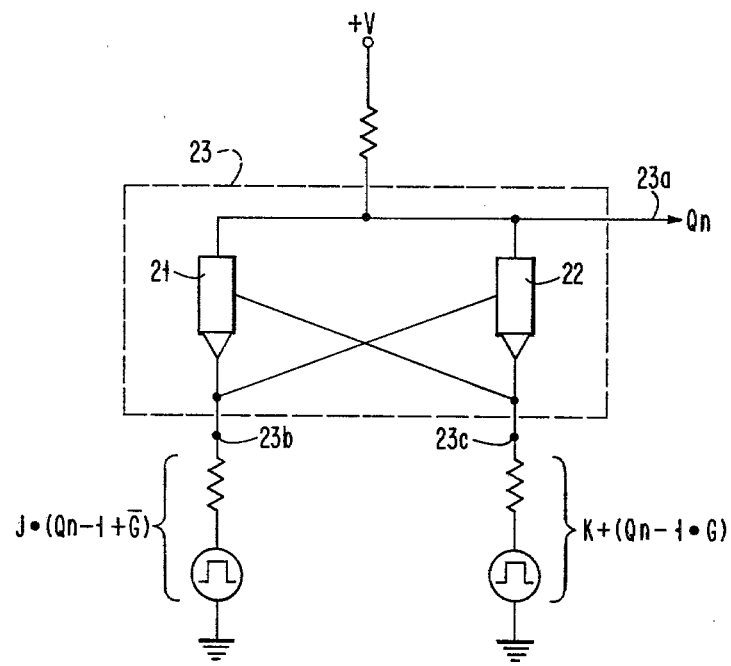
FIG. 2 is a schematic diagram showing the minimum implementation of the invention.

FIG. 2 illustrates a minimum implementation of the invention using bipolar integrated circuits. This implementation includes a pair of conventionally cross-coupled transistors 21, 22 to form a conventional EOR block 23. Block 23 has an output line 23a on which the output signal Qn appears, as well as two input lines. One input 23b is represented by the function shown in the logic representation of FIG. 1 and can be represented by the logic statement J·(Qn−1+G), J being one of the input signals and G being a control signal such as from a clock. The other input 23c to block 23 is represented by the logic statement K+(Qn−1·G), K being the other input signal.

The circuit of FIG. 2 operates to perform the J-K logic function when the G signal is present, such as from a clock, and to perform the EOR function when the G signal is not present.

Figure 3:
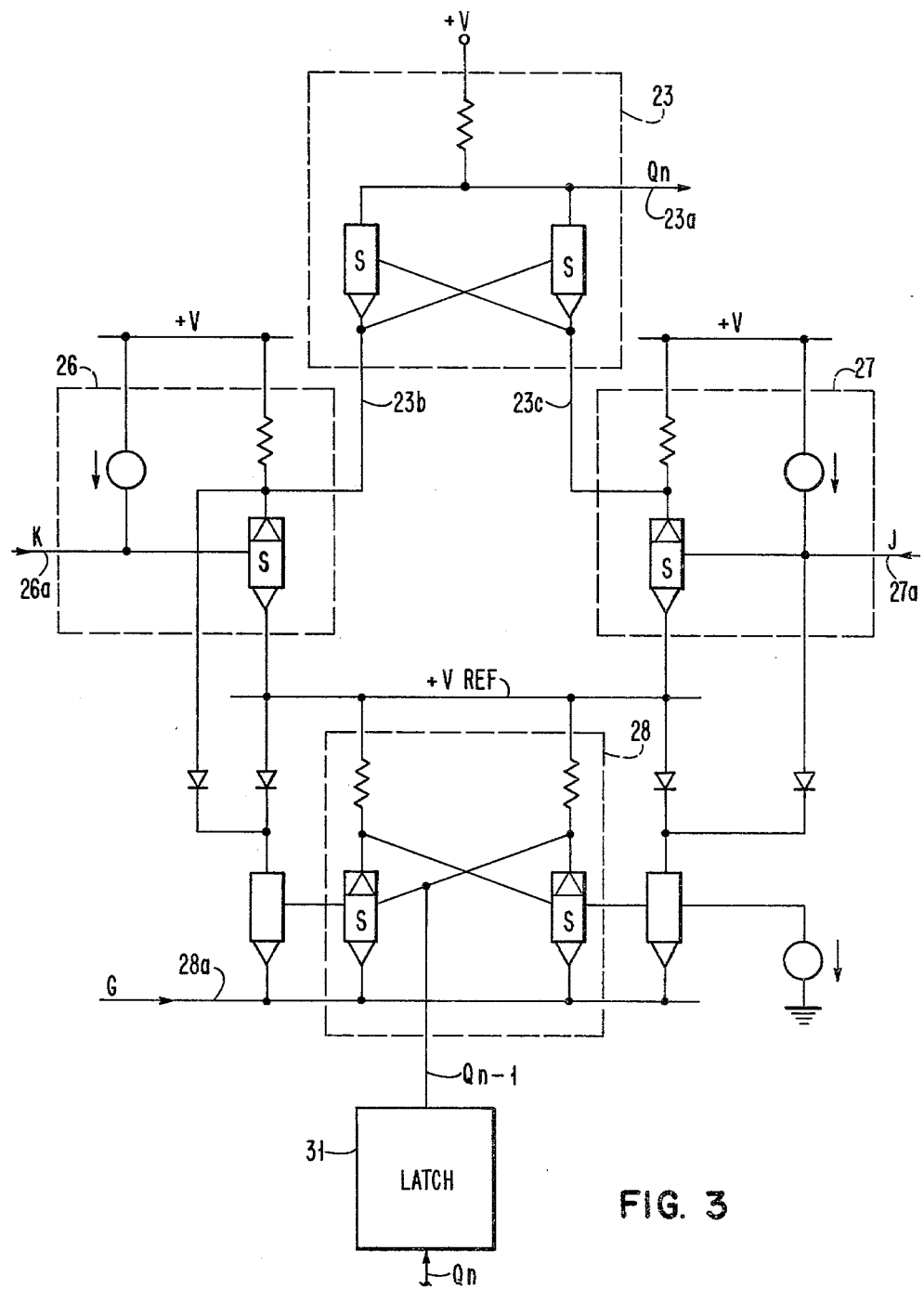
FIG. 3 is a schematic diagram showing an expanded implementation of the invention.

FIG. 3 shows an expanded implementation of the invention including the EOR block 23 shown in FIG. 2. These transistors in FIG. 3 which have an "S" identification are Schottky clamped transistors. One input to EOR block 23 is supplied through a sense amplifier 26 which has the K input signal supplied thereto on an input line 26a. Similarly, a second sense amplifier 27 is connected to input line 23c of EOR block 23 and has the J input signal supplied thereto on an input line 27a. Sense amplifiers 26, 27 are connected to a first latch 28. The control or clock signal G is supplied on an input line 28a and it is the presence or absence of a signal on this line which determines whether the circuit operates as a J-K logic circuit or an EOR logic circuit.

A second latch circuit 31 is connected to latch 28 and this second latch serves to store the previous value Qn−1 of the circuit output Qn and to supply this previous value when the circuit is functioning as a J-K logic circuit. When the circuit is functioning as an EOR logic circuit, as established by the G signal on line 28a, the Qn−1 output of latch 31 is not used.

I claim:

1. A logic circuit for performing a J-K function and an Exclusive OR (EOR) function comprising in combination:
   a cross-coupled transistor-transistor logic EOR block having two data inputs and a data output Qn;
   means for supplying the first input of said EOR block with the K signal input logically ORed with an X signal; and
   means for supplying the second input of said EOR block with the J signal input logically ANDed with a Y signal; where
   K and J are the data inputs;
   X is the logical AND of a Qn−1 signal and a G signal;
   Y is the logical OR of the Qn−1 signal and an inverted G signal,
   Qn−1 is the stored state of the previous data output signal; and
   the G signal is a control signal which enables the J-K function, and the inverted G signal enables the EOR function.

2. Apparatus in accordance with claim 1, including latch means responsive to said data output signal Qn for generating said Qn−1 signal.

3. Apparatus in accordance with claim 1, including voltage driving means for supplying said first and said second inputs of said EOR block.

4. Apparatus in accordance with claim 1, including sense amplifier means for supplying said first and second inputs of said EOR block.

5. Apparatus in accordance with claim 1, including first sense amplifier means for supplying said first input of said EOR block, and second sense amplifier means for supplying said second input of said EOR block.

6. A dynamically switchable logic block for generating either the Exclusive OR (EOR) logic function or the J-K logic function on a data output in response to a first and a second input signal, comprising in combination
   logic means for generating the EOR logic function;
   first sense amplifier means connected to said logic means and operable to accept said first input signal;
   second sense amplifier means connected to said logic means and operable to accept said second input signal; and
   storage means connected to said first and said second sense amplifier means and responsive to said data output for generating a signal representing the prior state of said data output, and
   control signal means connected to said storage means for determining the connection of said storage means to said sense amplifiers.

7. Apparatus in accordance with claim 6, in which said storage means includes a pair of latches.

* * * * *